（12）United States Patent
Fung et al.

(10) Patent No.: US 7,725,853 B1
(45) Date of Patent: May 25, 2010

(54) OPTIMIZING LONG-PATH AND SHORT-PATH TIMING AND ACCOUNTING FOR MANUFACTURING AND OPERATING CONDITION VARIABILITY

(75) Inventors: Ryan Fung, Mississauga (CA); Vaughn Betz, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/857,316

(22) Filed: Sep. 18, 2007

Related U.S. Application Data

(63) Continuation of application No. 11/002,976, filed on Dec. 1, 2004, now Pat. No. 7,290,232.

(51) Int. Cl.
 *G06F 17/50* (2006.01)
(52) U.S. Cl. .............................. 716/6; 716/5
(58) Field of Classification Search ....... 716/2, 716/4–6, 18
See application file for complete search history.

(56) References Cited

U.S. PATENT DOCUMENTS 6,763,506 B1 * 7/2004 Betz et al. ................. 716/6
7,254,789 B1 * 8/2007 Fung et al. ................. 716/2
7,290,232 B1 * 10/2007 Fung et al. ................. 716/6

\* cited by examiner

*Primary Examiner*—Jack Chiang
*Assistant Examiner*—Binh C Tat
(74) *Attorney, Agent, or Firm*—Townsend and Townsend and Crew LLP (57) ABSTRACT

Logic designs are optimized to satisfy long-path and short-path timing constraints for multiple process/operating condition corners. A path-based compilation phase determines an implementation for logic design paths, in part, by monitoring a set of paths that are important from a timing perspective and evaluating the timing performance of the set of monitored paths at one or more timing corners. A timing-analysis-based compilation phase determines transformations for converting sets of timing values from one timing corner to another timing corner. The compilation phase transforms timing delay values from one timing corner to another to facilitate analysis of timing performance at different corners. Timing slack values produced by analysis are transformed to map them from one timing corner to another. The transformed timing slack values from multiple corners are amalgamated. The amalgamated timing slack values are used by a compilation phase (that potentially only understands a single corner) to optimize a logic design for multiple corners.

11 Claims, 6 Drawing Sheets

OPTIMIZING LONG-PATH AND SHORT-PATH TIMING AND ACCOUNTING FOR MANUFACTURING AND OPERATING CONDITION VARIABILITY

CROSS-REFERENCES TO RELATED APPLICATIONS

This application is related to commonly-assigned, co-pending U.S. patent application Ser. No. 11/002,976, filed Dec. 1, 2004, entitled "Optimizing Long-Path and Short-Path Timing and Accounting for Manufacturing and Operating Condition Variability," by Fung et al., which is incorporated by reference.

BACKGROUND

The present invention relates to the field of logic devices, and the systems and methods for programming the same. Logic devices are electronic devices that are adapted to process data. Logic devices can be designed by specifying transistors or other switching devices and their connections to form individual logic gates that provide the desired functions. Logic devices can also be created by adapting a user design to standardized device architectures, such as structured ASICs (application-specific integrated circuits), standard cell architectures, and programmable devices.

Programmable devices, such as FPGAs (field-programmable gate arrays), typically include thousands of programmable logic cells that use combinations of logic gates and/or look-up tables to perform logic operations. Programmable devices also include a number of functional blocks having specialized logic devices adapted to a specific logic operations. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

A typical design cycle for determining the configuration of a programmable device, referred to as compilation, starts with an extraction phase, followed by a logic synthesis phase, a technology-mapping phase, a fitting phase (which can include clustering, placement, and routing), and an assembly phase. The extraction and synthesis phases take a user design, typically expressed in a hardware description language such as Verilog or VHDL (very-high-speed integrated circuit hardware description language), and produce a set of logic gates implementing the user design. In the technology-mapping phase, the set of logic gates is permutated over the hardware architecture of the programmable device in order to match elements of the user design with corresponding types of elements of the programmable device. The clustering, placement, and routing phases assign the various portions of the user design to specific logic cells and functional blocks and determine the configuration of the configurable switching circuit used to route signals between these logic cells and functional blocks, taking care to satisfy the user timing constraints as well as possible. In the assembly phase, a configuration file defining the programmable device configuration is created. The configuration can then be loaded into a programmable device to implement the user design.

To meet performance targets, timing constraints are specified for user designs. Long-path timing constraints specify the maximum amount of delay permitted in the various portions of the user design. If a long-path timing constraint is violated, a signal will not arrive at its intended destination in time and the user design may malfunction. Short-path timing constraints specify the minimum amount of delay permitted in the various portions of the user design. If a short-path timing constraint is violated, a signal arrives at its destination too early, potentially overwriting the previous value at the destination before it can be processed. Timing constraints can be specified by designers or automatically generated based upon general performance requirements of a user design. Additionally, designers using more sophisticated design techniques can specify some timing constraints to control specific aspects of the user design implementation, such as clock skew. All logic designs are subject to similar timing constraints regardless of the logic device implementation style used (custom logic, standard cells, structured ASICs, programmable devices, etc.). Consequently, most design timing optimization techniques are applicable to all implementation styles and although the invention will be discussed primarily with reference to programmable devices, it is equally applicable to all logic implementation styles.

Due to manufacturing variations, the performance capabilities of logic devices may vary from device to device. Furthermore, different operating conditions, for example due to temperatures and voltage variations, can also affect the performance capabilities of logic devices. To cope with these and other causes of variation, each set of performance capabilities of a logic device is modeled by a process/operating condition corner (sometimes referred to as a timing corner or a corner). Each corner represents the set of timing delays for the various portions of the logic device. Additionally, performance capabilities can vary within each logic device, for example due to manufacturing variations, rise/fall signal delay differences, and operating condition variations; these variations are sometimes referred to as intra-corner variations. Therefore, each corner can include a range of timing delays for each portion of the logic device.

To ensure that a user design operates correctly when implemented, the user design must be implemented so as to satisfy both long-path and short-path timing constraints. However, typical compilation tools only optimize user designs to satisfy long-path timing constraints. Designers must then manually modify and re-optimize their designs to satisfy short-path timing constraints.

Additionally, user designs must be verified to operate correctly when implemented, despite the performance variability of individual devices due to manufacturing and operating condition variations. Unfortunately, typical compilation tools cannot simultaneously optimize a user design for multiple corners. Instead, compilation tools optimize user designs for a single corner; designers must then manually optimize user designs for additional corners. Furthermore, typical compilation tools cannot take into account the variability of performance capabilities within a logic device.

Therefore, a system and method that optimizes user designs to satisfy both long-path and short-path timing constraints is desirable. It is further desirable for the system and method to simultaneously optimize user designs for multiple process corners, and operating conditions, and to take into account the variability of performance capabilities within a logic device. It is also desirable for the system and method to be implemented in one or more stages of the compilation process. Additionally, it is desirable for the system and method to integrate easily with previous single-corner compilation methods.

SUMMARY

An embodiment of the invention optimizes user designs to satisfy long-path and short-path timing constraints at one or more corners. A path-based compilation phase determines an initial configuration for a set of paths in the user design. The path-based compilation phase identifies a subset of potentially problematic paths from a timing perspective, such as the paths that are the worst violators of their timing constraints or are closest to violating their timing constraints. This subset of the paths in the design will be closely monitored during the compilation phase. In embodiments, the compilation phase tries to optimize the design using a cost function, based on the set of monitored paths, and the delays of the respective path elements from one or more corners. The compilation phase may reevaluate the user design occasionally to detect additional potentially problematic paths that emerge as design optimization progresses. By monitoring paths with respect to both short-path and long-path timing constraints, simultaneous optimization of user designs for short-path and long-path timing can be achieved.

In another embodiment, a timing analysis-based compilation phase determines a set of transformations for converting timing values, such as delays, from a base corner to any other corner. The compilation phase transforms timing values for connections at the base corner to timing values at other corners and uses timing analyses to determine corner-specific slack values for each connection. An inverse-transform is applied to change the corner-specific slack values to equivalent values in the base corner, and base-corner connection slack values are conservatively updated based on all the transformed corner-specific slack values of each connection. The compilation phase uses the resulting set of base-corner connection slack values to optimize the user design using single-corner techniques. However, because the base-corner connection slack values are based on timing values from multiple corners, this approach will optimize the user design for multiple corners. Both short-path and long-path timing analyses and slacks can be used by this approach to simultaneously optimize short-path and long-path timing.

BRIEF DESCRIPTION OF THE DRAWINGS

The invention will be described with reference to the drawings, in which.

In the drawings, the use of identical reference numbers in different drawings indicates similar components.

DESCRIPTION OF EXEMPLARY EMBODIMENTS

Figure 1:
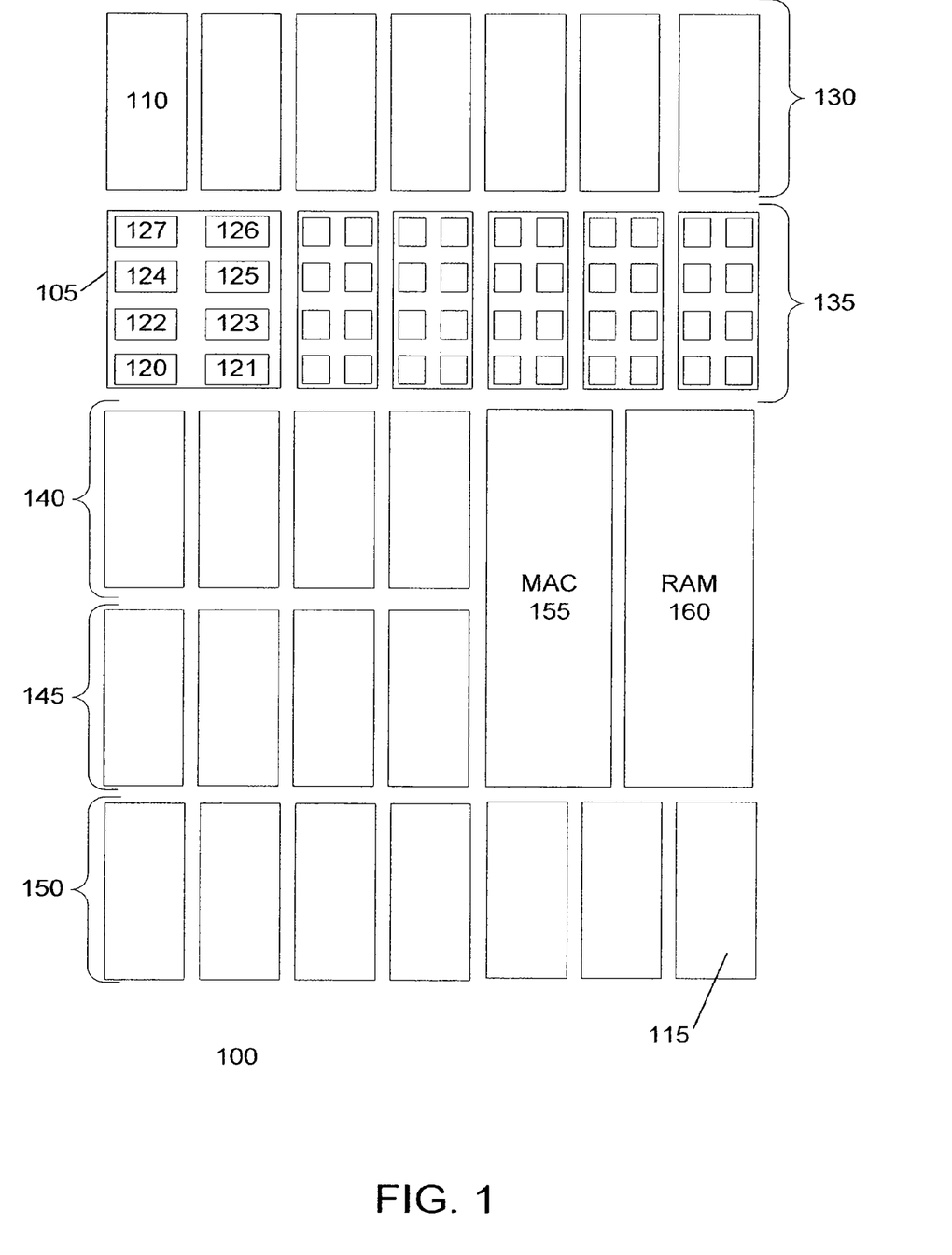
FIG. 1 illustrates a portion of an example programmable device suitable for use with an embodiment of the invention.

FIG. 1 illustrates a portion of an example programmable device 100 suitable for use with an embodiment of the invention. Programmable device 100 includes a number of logic array blocks (LABs), such as LABs 105, 110, 115. Each LAB includes a number of programmable logic cells using logic gates and/or look-up tables to perform a logic operation. LAB 105 illustrates in detail logic cells 120, 121, 122, 123, 124, 125, 126, and 127. Logic cells are omitted from other LABs in FIG. 1 for clarity. The LABs of device 100 are arranged into rows 130, 135, 140, 145, and 150. In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently.

In addition to logic cells arranged in LABs, programmable device 100 also includes specialized functional blocks, such as multiply and accumulate block (MAC) 155 and random access memory block (RAM) 160. For clarity, the portion of the programmable device 100 shown in FIG. 1 only includes a small number of logic cells, LABs, and functional blocks. Typical programmable devices will include many thousands, or hundreds of thousands, of these elements.

Figure 2:
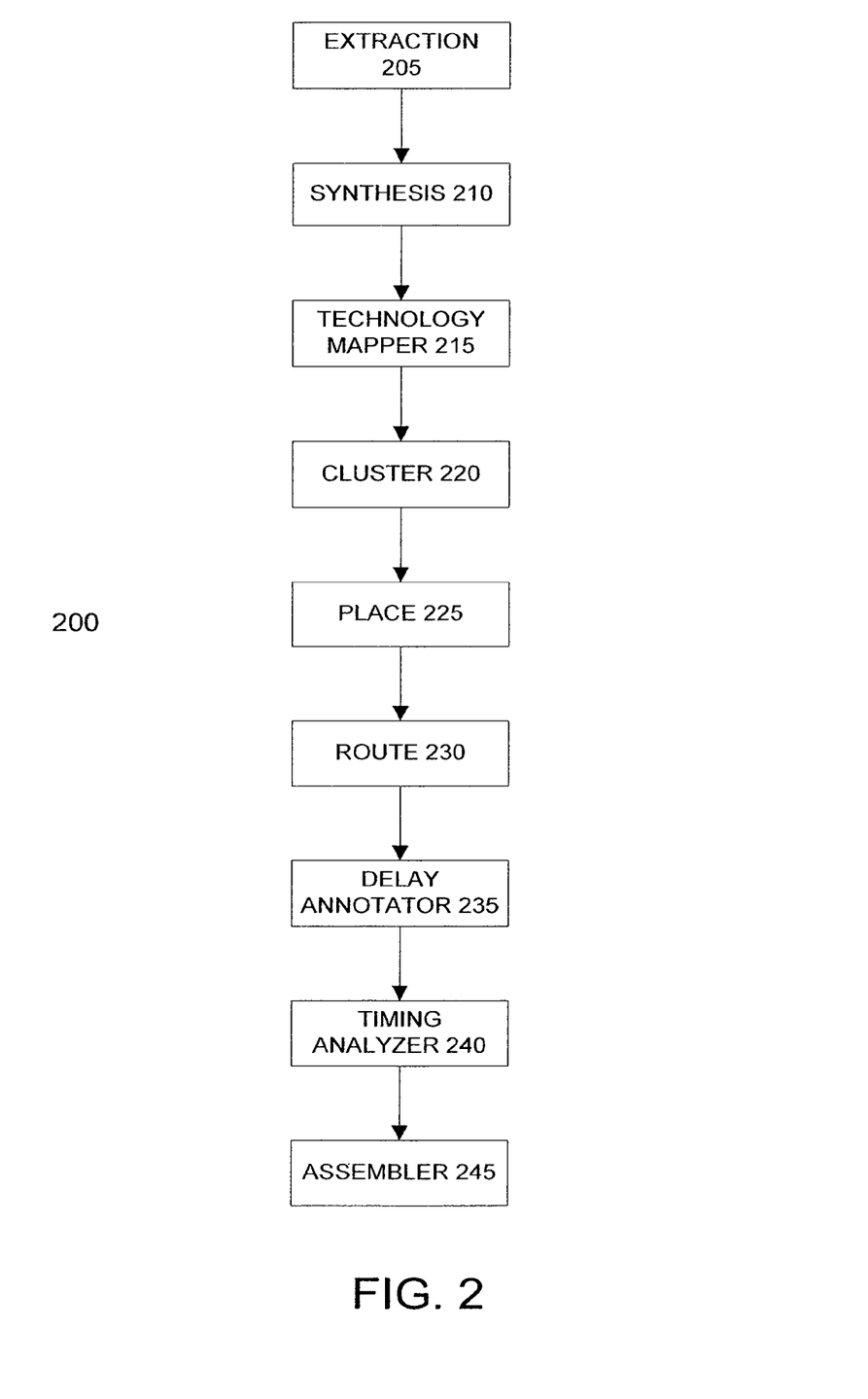
FIG. 2 illustrates the phases of a typical compilation process suitable for implementing an embodiment of the invention.

FIG. 2 illustrates the phases of a typical compilation process 200 suitable for implementing an embodiment of the invention. The compilation process 200 converts a user design into a programmable device configuration adapted to configure a programmable device to implement the user design. The extraction phase 205 converts a description of the user design, expressed for example in a hardware description language, into a register transfer layer description.

Synthesis phase 210 converts the register transfer layer description of the user design into a set of logic gates. Technology mapping phase 215 maps the set of logic gates into a set of atoms, which are irreducible constituents of the user design. In an embodiment, atoms correspond to groups of logic gates and other components of the user design matching the capabilities of the logic cells or other functional blocks of the programmable device. A given user design may be converted into any number of different sets of atoms, depending upon the underlying hardware of the programmable device used to implement the user design.

Following the technology mapping phase 215, the cluster phase 220 groups related atoms together into clusters. The place phase 225 assigns clusters of atoms to locations on the programmable device. The route phase 230 determines the configuration of the configurable switching circuit of the programmable device used to connect the atoms implementing the user design.

The delay annotator phase 235 determines the signal delays for the set of atoms and their associated connections in the configurable switching circuit using a timing model of the programmable device. The timing analysis phase 240 determines whether the implementation of the user design in the programmable device will meet the long-path and short-path timing requirements specified by the designer.

The assembler phase 245 generates configuration information specifying the configuration of the programmable device implementing the user design, including the configuration of each of the logic cells used to implement the user design and the configuration of the configurable switching circuit used to connect the logic cells. The assembler phase 245 can write the configuration information to a configuration file, which can then be used to configure one or more programmable devices to implement instances of the user design.

An embodiment of the invention replaces one or more of the above discussed compilation phases with a compilation phase that optimizes the user design to satisfy both long-path and short-path timing constraints. In one embodiment, a path-based compilation phase optimizes user designs to satisfy both long-path and short-path timing constraints. A path is any series of one or more connections between a path start point and a path end point—connections may be external to functional blocks (from an output to an input) or within functional blocks (input to output). Typically, a path start point can be the output of a first data register or other data storage element, or it can be an input IO, for example. Typically, a path end point can be the input of a second data register or other data storage element, or it can be an output IO, for example. Typically, each path includes one or more levels of combinational logic.

Figure 3:
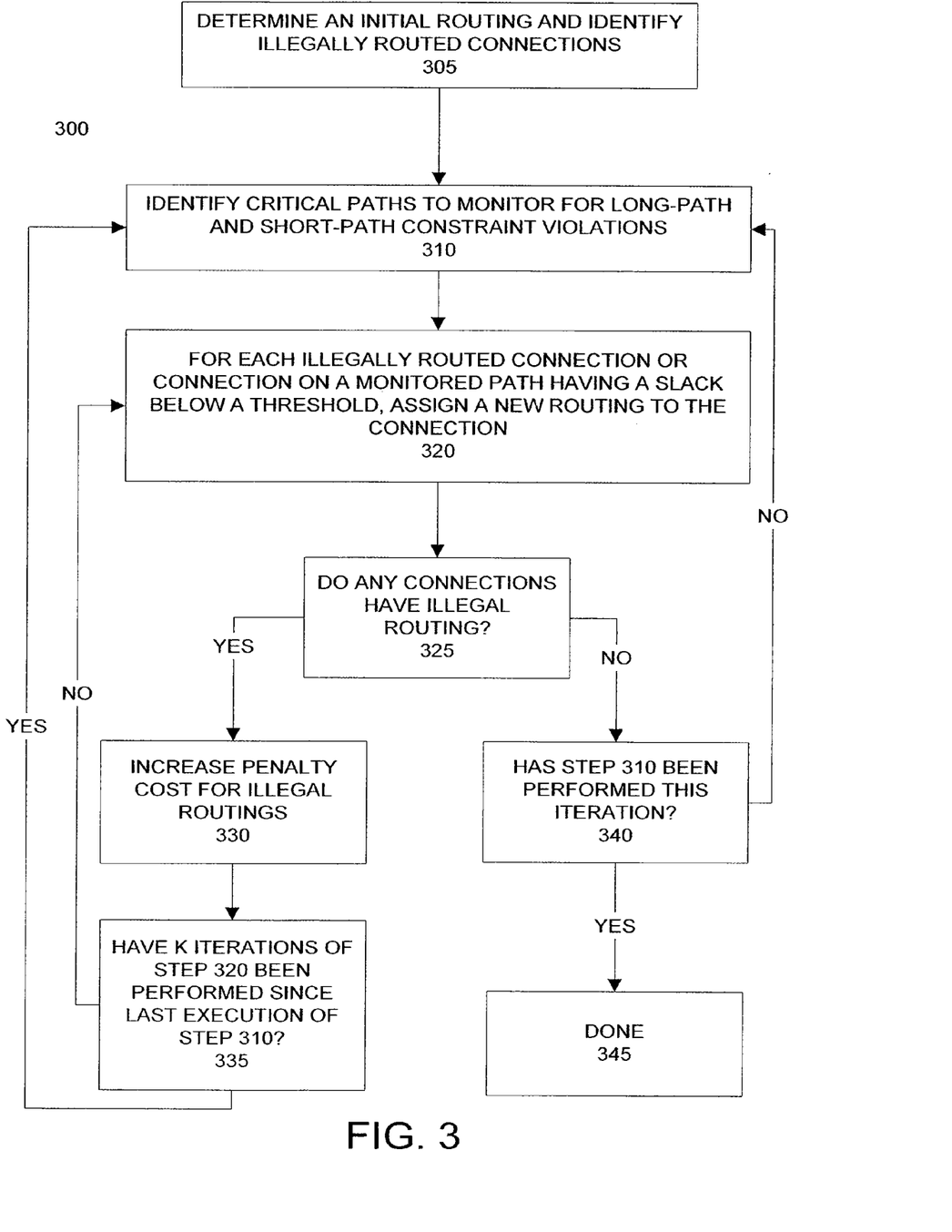
FIG. 3 is a flowchart illustrating a method for optimizing a user design to satisfy short-path and long-path timing constraints according to an embodiment of the invention.

FIG. 3 is a flowchart illustrating a path-based method 300 for optimizing a user design to satisfy short-path and long-path timing constraints according to an embodiment of the invention. As an example, the method 300 is implemented in the routing phase of the compilation process. However, the path-based method 300 is generally applicable to any compilation phase. Additionally, method 300 optimizes user designs to satisfy long-path and short-path timing constraints for a single corner (i.e. a process corner and operating condition); however, as discussed in detail below, this method can be extended to optimize user designs to satisfy multiple corners.

Step 305 determines an initial routing configuration for all of the connections of a user design. The initial routing configuration can be determined using conventional routing techniques. In an embodiment, the initial routing configuration of step 305 takes into account the routing resource constraints of the programmable device and the user design, and attempts to minimize delay. The initial routing configuration of step 305 ignores illegally routed paths, such as shorts, which occur when two signals are selected to drive the same routing resource. Additionally, step 305 identifies the illegally routed connections of the user design.

Step 310 performs a long-path timing analysis. The long-path timing analysis identifies a set of critical long paths. In an embodiment, critical long paths are identified as having the smallest long-path timing slack values. The long-path slack value of a path is: (long-path timing constraint)−(path delay). The long-path slack value represents how much delay can be added to a path before it violates its timing constraint. In some embodiments, this timing analysis produces M critical long paths, where M is an arbitrary value. In alternate embodiments, the set of critical long paths includes paths of the user design having long-path slack values below a certain threshold. In some embodiments, the set of critical long paths can be identified by performing a timing analysis to compute connection slacks from the timing constraints. After that, additional traversals can be used to try to find paths with low slack by selectively traversing through the design based on the connection slacks computed (tracing through connections with low slack). Additionally, step 310 adds the set of critical long-paths to a set of monitored paths, recording the constraints associated with those timing paths.

Step 310 also performs a short-path timing analysis. The short-path timing analysis identifies a set of critical short paths. In an embodiment, critical short paths are identified as having the smallest short-path timing slack values. The short-path slack value of a path is: (path delay)−(short-path timing constraint). The short-path slack value represents how much delay can be removed from a path before it violates its timing constraint. In an embodiment, this timing analysis produces N critical short paths, where N is an arbitrary value. In an alternate embodiment, the set of critical short paths includes all of the paths of the user design having short-path slack values below a certain threshold. In some embodiments, the set of critical short paths can be identified by performing a timing analysis to compute connection slacks from the timing constraints; after that, additional traversals can be used to try to find paths with low slack by selectively traversing through the design based on the connection slacks computed (tracing through connections with low slack). Additionally, step 310 adds the set of critical short paths to the set of monitored paths, recording the constraints associated with those timing paths.

For illegally routed connections and for the connections in each path, in the set of monitored paths, having a slack value less than a threshold value, step 320 determines a new routing configuration. In determining new routing configurations, step 320 attempts to select routing resources that have not been previously assigned to other paths, so as to avoid creating additional shorts. Additionally, step 320 attempts to maximize the long-path or short path slack values associated with the monitored paths as it determines its new routing configuration. For a long-path critical path, step 320 decreases the path's timing delay so as to increase the timing long-path slack. Conversely, for a short-path critical path, step 320 increases the path's timing delay, which increases the timing short-path slack.

In an embodiment, step 320 determines routing configurations, for each connection being re-routed, by performing a search through a graph of routing resources from the source of the connection to the destination of the connection. In an embodiment, only one connection is re-routed at a time. A cost function can be used to determine which routing resources should be used to implement the connection. Each routing resource can be assigned a cost value based on the cost function, and an embodiment of step 320 performs a directed search to find the best routing path based on the cost values assigned to the various resources. An embodiment of the cost function can incorporate a measure of the delay from the source, or beginning of a path, to a current routing resource, a measure of the delay in the current routing resource, and a look-ahead estimated delay from the current resource to the destination. The cost function, for a routing resource, can also include a penalty term based on the how many signals are trying and have tried to use the resource. This penalty is a measure of the current and historical routing illegality. Finally, the cost function can be based on the set of monitored paths associated with the current connection.

In an embodiment, the cost function associated with a given routing resource is defined as the penalty value for any illegal shorts minus some function (F) of the smallest slack value of the set of monitored paths associated with the current connection. The smallest slack value is based upon the estimated timing delay for the given connection if the given resource is selected, and the current delay of all other connections (only one connection is re-routed at a time). In an embodiment, the estimated timing delay for a given routing resource is the sum of the delay from the source to the current routing resource, the delay in the current routing resource, and the look-ahead estimated delay from the current resource to the destination. F can be a simple linear function of the smallest slack value or F may be a piece-wise linear function of the smallest slack value so that the step 320 will prioritize satisfying timing when routing connections with small slack and prioritize reducing illegalities, such as shorts, when routing connections with a lot of slack.

In further embodiments, the function (F) discussed above can be replaced with alternative formulations. Examples of alternative formulations include: the average slack value of all relevant monitored paths; a weighted average of the slack values of all relevant monitored paths, where the weighting emphasizes paths having smaller, and hence more critical, slack values; and a weighted average of the slack values of all monitored paths, where the weighting accounts for the coarse differences in slack values at different corners. In an additional embodiment, the formulation may be a combination of one or more of the above Step 325 evaluates the routing of all paths following the determination of new routing configurations in step 320. If any paths have illegal routing configurations, then method 300 proceeds to step 330. Conversely, if none of the set of monitored paths have illegal routing configurations, then method 300 proceeds to step 340.

Step 330 increases the penalty value associated with illegal routing configurations in the cost function. By increasing the penalty value, subsequent attempts to determine routing configurations will more aggressively avoid selecting routing resources that would result in shorts and select alternate routing resources. Initially, the penalty term is small, so that the router starts by determining good solutions from a timing perspective. Subsequent iterations of method 300 gradually increase the value of the penalty, so that a legal configuration is found without unduly sacrificing timing quality.

To reduce execution time and computational resource requirements, method 300 evaluates only timing critical paths in a user design, which may be a subset of the total number of paths in a user design. However, the determination of new routing configurations to resolve illegality or improve timing can inadvertently force other paths that were previously not timing critical to become timing critical.

To ensure that any paths rendered timing critical by step 320 are also optimized to satisfy long-path and short-path timing constraints, method 300 tracks the number of iterations of step 320 performed after the most recent iteration of step 310. Step 335 determines if the number of iterations exceeds K, a threshold value. If the number of iterations of step 320 after the most recent iteration of step 310 equals or exceeds K, then method 300 proceeds back to step 310. Step 310 is then repeated to identify any additional paths that have become timing critical. Alternatively, if the number of iterations of step 320 after the most recent iteration of step 310 is less than K, then method 300 proceeds back to step 320.

Following an additional iteration of step 310, or alternatively, if the number of iterations of step 320 after the most recent iteration of step 310 is less than K, following step 335, a subsequent iteration of step 320 re-evaluates illegally routed connections using the increased penalty value and determines new routing configurations. Additionally, step 320 determines new routing configurations for any connections on timing critical monitored paths.

Following step 320, step 325 once again determines if there are any paths having illegal routing configurations. If any paths have illegal routing configurations, steps 330; 335; 310, if necessary; and 320 are repeated. Otherwise, if there are no illegally routed paths, the method proceeds to step 340. Step 340 evaluates whether step 310 has been performed in this iteration of the method 300. If it has not been executed in the most recent iteration of method 300, the method 300 returns to step 310 to check to see if any other paths have become timing critical. Conversely, if method 300 has executed step 310 in the current iteration and has not identified any new illegally routed paths, then after step 340, method 300 finishes at step 345.

The method 300 can be extended to optimize a user design to simultaneously satisfy long-path and short-path timing constraints for several corners. In an embodiment, designers specify a set of corners under which the user design must operate correctly. Each corner corresponds to a set of operating conditions and/or manufacturing conditions of the programmable device used to implement the user design. Each corner includes a set of timing delays for the various portions of the programmable devices, representing the effects of the corresponding operating conditions and/or manufacturing variations on the performance of the programmable device. Additionally, as the performance capabilities within each programmable device can vary due to manufacturing variations and differences in rise/fall delays, for example, each corner can include a range of timing delays for each portion of the programmable device.

To optimize a user design to simultaneously satisfy long-path and short-path timing constraints for several corners, a modified embodiment of step 310 performs a long-path and a short-path timing analysis of the user design for each corner. For each corner, step 310 identifies the long-path and short-path timing critical paths, and adds these paths and their respective constraints to the set of monitored paths. Step 310 is repeated for each corner, so that the set of monitored paths includes timing critical paths under any of the corners. It should be noted that this includes paths that are critical under multiple corners as well as paths that are critical under a single corner. In a further embodiment, step 310 records the corner or corners associated with each monitored path to track which corners' delays should be considered during optimization.

In a further embodiment of step 310, the timing analyses can be conservative in order to account for the effect of delay variation within a programmable device. That is, when determining whether a given path is critical, a long-path timing analysis should conservatively use maximum delays along the data-path, maximum delays from the clock to the source of the path, and minimum delays from the clock to the destination of the path. Similarly, the constraint associated with the monitored path can be determined conservatively, and, in some embodiments, several conservative constraints (one for each corner) may be associated with a monitored path. In some embodiments, for each monitored path, only the most conservative subset of constraints may be used to reduce computation time; in some embodiments, a conservative constraint is conservatively computed (for a corner) from the set of several constraints—using similar techniques to the transformation techniques described later.

Following the modified step 310, a modified step 320 determines new routing configurations. In this embodiment, the step 320 maintains separate delay data for each monitored path for each corner. For example, if the user design is being optimized to operate at N corners, then step 320 will maintain up to N different delay values for each routing resource. Additionally, the delay values for each monitored path used by the cost function can be stored as an array of delay values, with each entry corresponding to the delay value at a given corner.

Depending on the cost function formulation, this delay information and constraint information can be handled in different ways. If the smallest slacks are of interest, an embodiment of step 320 emphasizes the worst slack at all corners. In another embodiment, if the weighted average of slacks is of interest, step 320 can use a weighting scheme to compare the slacks at various corners. All corners can be weighted equally, or weights can be used to adjust the various corner slacks based on the coarse delay differences between the corners (for example, smaller slacks may be reasonable at a very fast corner).

In another embodiment, to account for delay variation within a programmable device, 4*N different delay values for each routing resource may be maintained. For each of the N corners, the delay of a routing resource may be a function of the maximum possible rise delay, the minimum possible rise delay, the maximum possible fall delay, and the minimum possible fall delay. By keeping track of these four types of delays at all corners while routing, step 320 can conservatively account for delay variation within a programmable device in addition to the delay variation between corners. For example, when evaluating long-path timing, the router may consider the max(max rise delay, max fall delay) of the connection when examining the respective monitored paths. Note that in some embodiments the constraints associated with a monitored path may be extra-conservative to compensate for under-conservative delay estimates. In other embodiments, the constraints may rely on conservative sophisticated delay estimates for conservative optimization. Generally, the entire compilation tool needs to be considered to ensure a desirable overall level of conservatism is achieved.

Following the modified step 320, the remainder of the method 300 proceeds as described above. Once the method reaches step 345, the resulting routing configuration for the user design will be optimized to satisfy long-path and short-path timing constraints at all of the corners specified by the designer. Although method 300 has been discussed with respect to the routing phase of the compilation process, it can be similarly applied to the synthesis, technology mapping, clustering, and/or placement phases as well. In these embodiments, the conventional phases are modified to compare the effects different alternatives have on the slacks of monitored paths.

The above-discussed path-based optimization technique provides a great deal of flexibility in optimizing user designs. The path-based approach does not assume any correlation between the changes in timing delays experienced by portions of the programmable device at different corners. Therefore, the differences in timing delays for one portion of the programmable device at different corners can be unrelated to the differences in timing delays for other portions of the programmable device without adversely affecting design optimization. For example, the timing delay of portion A of the programmable device at corner X can be less than that at corner Y. Simultaneously, the timing delay of portion B of the programmable device at corner X can be greater than that at corner Y.

As an alternative to the path-based optimization technique, an alternate embodiment of the invention replaces one or more of the above discussed compilation phases with a timing analysis-based compilation phase that optimizes the user design to satisfy both long-path and short-path timing constraints. An embodiment of the timing analysis-based compilation phase optimizes user designs to function at multiple corners, by producing and using only one short-path and one long-path timing slack value for each connection. As a result, an embodiment of this aspect of the invention can be integrated with any compilation phase that incorporates timing slack values, including single-corner compilation phases.

Figure 4:
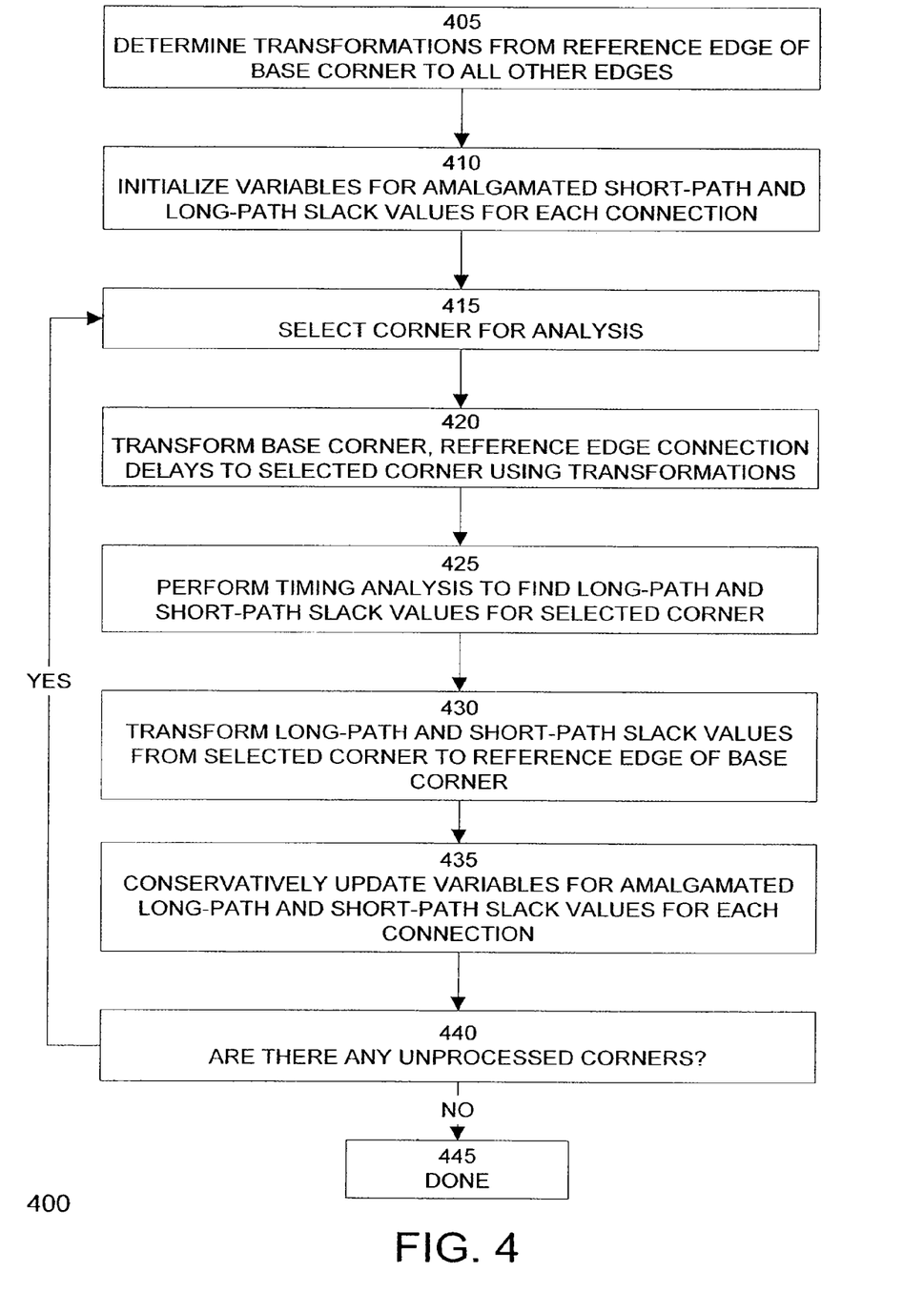
FIG. 4 is a flowchart illustrating a method for optimizing a user design to satisfy short-path and long-path timing constraints at multiple corners according to an embodiment of the invention.

FIG. 4 is a flowchart illustrating a method 400 for timing analysis which produces slacks that enable optimization of a user design to satisfy short-path and long-path timing constraints at multiple corners according to an embodiment of the invention. Method 400 selects a base corner to be used during optimization from the set of corners specified by a designer. Method 400 then determines a set of transformations that can be used to convert timing delay values from the base corner to equivalent timing delay values in any of the other corners. By applying these transformations and respective timing slack transformations, method 400 can determine "amalgamated" slack values for the base corner that are based upon the delay and slack values at all corners. As a result, a user design can be optimized to satisfy timing at all of the corners, if a single-corner algorithm optimizes considering these amalgamated slack values.

Method 400 begins with a user design and a set of corners specified by a designer. Step 405 selects one of the corners as a base corner. If the base corner includes a range of timing delays within a corner, then, in an embodiment, outer bounds of the range of timing delays, also referred to as edges, are determined. Step 405 then selects one of the edges of the base corner as the reference edge. As discussed in detail below, in an embodiment of method 400, the timing of the user design is optimized with respect to the reference edge of base corner. In other embodiments, the timing of the user design is optimized with respect to only the base corner because the optimization algorithm itself considers delay variation within a corner.

The selection of the base corner and reference edge is arbitrary and can be chosen based on the needs of the respective single-corner optimization algorithm if it favors a corner for delay modeling convenience. After selecting a base corner and reference edge from the set of corners, step 405 determines a set of transformations to be used to convert timing values from the base corner and reference edge to equivalent timing values at each corner of the set of corners, and if necessary, their respective edges. In an embodiment, step 405 assumes the timing delays of the various portions of the programmable device change in a correlated fashion between the different corners. In a further embodiment, it is assumed that timing values change almost linearly between corners, so that satisfying timing at all the corners will satisfy timing at all points in the process and operating condition space; For logic devices having non-linear timing changes between corners, additional corners can be added to linearize the timing characteristics.

Figure 5:
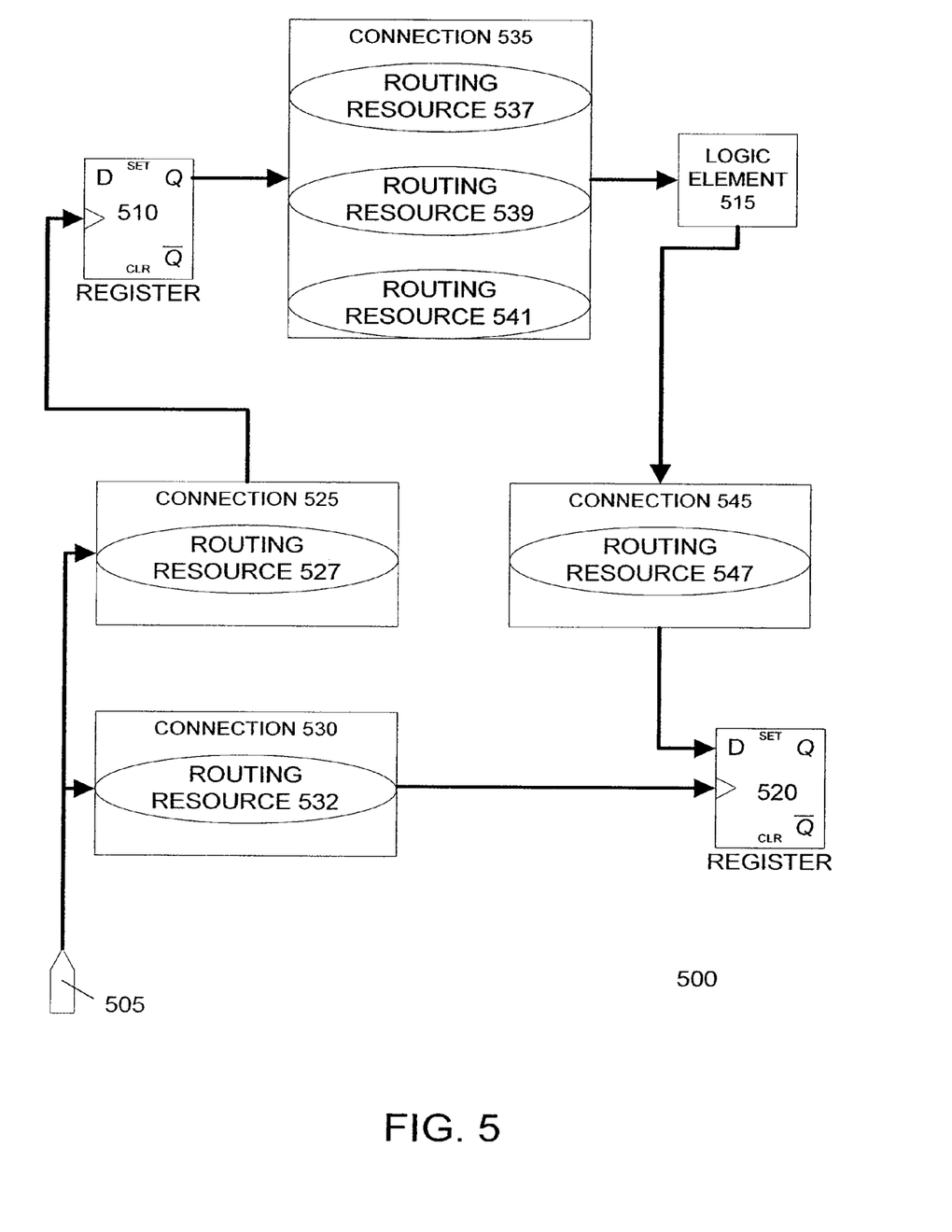
FIG. 5 illustrates an example user design to be optimized according to an embodiment of the invention.

To demonstrate the determination of a set of transformations in step 405, FIG. 5 illustrates an example user design 500 to be implemented in a programmable device. The example user design 500 is simplified for clarity, and the above-described methods can be applied to vastly more complicated user designs. User design 500 includes a clock signal 505 connected with registers 510 and 520 via connections 525 and 530, respectively. The output signal of register 510 is processed by logic element 515, which performs a combinatorial logic function, and then input into register 520. Connections 535 and 545 carry signals between register 510, logic element 515, and register 520.

Each connection can be associated with one or more routing resources of the programmable device (for example), which are used to convey signals between portions of the programmable device. In this example, connections 525 and 530 are associated with routing resources 527 and 532, respectively. Connection 535 is associated with routing resources 537, 539, and 541. In this example, one of the three routing resources, 537, 539, or 541, can be selected to connect register 510 with logic element 515. The remaining unselected routing resources will be unused or, alternatively, used for other portions of the user design omitted from FIG. 5.

A set of corners can be specified for this example user design. In an embodiment, each corner specifies timing values for each component within the programmable device to be used to implement the user design. By matching the portions of the user design with the timing values specified for each corner—based on the current implementation being considered for the user design in the programmable logic device—the timing performance of the user design at each corner can be determined. Table 1 lists a set of timing delay values for a set of two corners: the fast corner and the slow corner. However, it should be noted that method 400 is applicable for use with any arbitrary number of corners.

TABLE 1

EXAMPLE TIMING DELAY VALUES FOR SLOW AND FAST CORNERS

| RESOURCE | SLOW CORNER | FAST CORNER |
|---|---|---|
| Logic Element 515 | 380 ps +/− 20 ps | 190 ps +/− 10 ps |
| Routing Resource 537 | 375 ps +/− 25 ps | 190 ps +/− 10 ps |
| Routing Resource 539 | 665 ps +/− 35 ps | 400 ps +/− 20 ps |
| Routing Resource 541 | 950 ps +/− 50 ps | 525 ps +/− 25 ps |
| Routing Resource 547 | 95 ps +/− 5 ps | 45 ps +/− 5 ps |
| Routing Resource 527 | 2.7 ns +/− 0.3 ns | 1.35 ns +/− 0.15 ns |
| Routing Resource 532 | 2.7 ns +/− 0.3 ns | 1.35 ns +/− 0.15 ns |

To account for the variations in performance within a given programmable device, each corner specifies a range of delay values for each portion of the user design. For the purposes of discussion, the set of maximum delays for a given corner is referred to as the slow edge of that corner. Similarly, the set of minimum delays for a given corner is referred to as the fast edge of that corner. Table 2 lists the slow and fast edges for each of the example corners.

TABLE 2

EXAMPLE TIMING DELAY VALUES FOR SLOW AND FAST EDGES AT SLOW AND FAST CORNERS

| | SLOW CORNER | | FAST CORNER | |
|---|---|---|---|---|
| RESOURCE | SLOW EDGE | FAST EDGE | SLOW EDGE | FAST EDGE |
| Logic Element 515 | 400 ps | 360 ps | 200 ps | 180 ps |
| Routing Resource 537 | 400 ps | 350 ps | 200 ps | 180 ps |
| Routing Resource 539 | 700 ps | 630 ps | 420 ps | 380 ps |
| Routing Resource 541 | 1000 ps | 900 ps | 550 ps | 500 ps |
| Routing Resource 547 | 100 ps | 90 ps | 50 ps | 40 ps |
| Routing Resource 527 | 3 ns | 2.4 ns | 1.5 ns | 1.2 ms |
| Routing Resource 532 | 3 ns | 2.4 ns | 1.5 ns | 1.2 ns |

Applying the method 400 to the above example user design and set of corners, step 405 selects the slow edge of the slow corner as the base corner and the reference edge. Next, step 405 determines a set of transformations to the other edges and corners from the base corner and reference edge. In an embodiment, the set of transformations can be expressed as a set of scaling factors. For example, the timing delay of the logic element 515 at the fast edge of the slow corner is 360 picoseconds and at the slow edge of the slow corner is 400 picoseconds. Therefore the scaling factor from the slow edge of the slow corner to the fast edge of the slow corner is 360/400=0.9. The scaling factors from the base corner and reference edge to the other corners are determined in a similar fashion. Table 3 lists the scaling factors from the base corner and reference edge (which in this example is the slow edge of the slow corner) to each of the other example corners and edges.

TABLE 3

EXAMPLE TRANSFORMATIONS FROM SLOW EDGE OF SLOW CORNER

| | SLOW CORNER | | FAST CORNER | |
|---|---|---|---|---|
| RESOURCE | SLOW EDGE | FAST EDGE | SLOW EDGE | FAST EDGE |
| Logic Element 515 | 1 | 360/400 = 0.9 | 200/400 = 0.5 | 180/400 = 0.45 |
| Routing Resource 537 | 1 | 350/400 = 0.875 | 200/400 = 0.5 | 180/400 = 0.45 |
| Routing Resource 539 | 1 | 630/700 = 0.9 | 420/700 = 0.6 | 380/700 = 0.542 |
| Routing Resource 541 | 1 | 900/1000 = 0.9 | 550/1000 = 0.55 | 500/1000 = 0.5 |
| Routing Resource 547 | 1 | 90/100 = 0.9 | 50/100 = 0.5 | 40/100 = 0.4 |
| Routing Resource 527 | 1 | 2.4/3 = 0.8 | 1.5/3 = 0.5 | 1.2/3 = 0.4 |
| Routing Resource 532 | 1 | 2.4/3 = 0.8 | 1.5/3 = 0.5 | 1.2/3 = 0.4 |

As each routing resource is associated with a connection, step 405 can also express these scaling factors in terms of their associated connections. For connections 525, 530, and 545, there is only one routing resource associated with each connection; therefore, the scaling factors for these connections are the same as the scaling factors of their respective routing resources. However, connection 535 includes three alternative routing resources 537, 539, and 541; therefore the scaling factor for connection 535 can be a conservative combination of these three routing resource scaling factors. When transforming to a fast edge, the timing delay value of a connection can correspond with a set of lower bounds of the timing delays of all of the associated routing resources. Thus, a minimum function can be used to select the minimum scaling factor of the associated routing resources for a connection at a fast edge. Similarly, the timing delay value of a connection at a slow edge can correspond with a set of upper bounds of the timing delays of all of the associated routing resources. Thus, a maximum function can be used to select the maximum scaling factor of the associated routing resources for a connection at a slow edge. Table 4 illustrates the scaling factors associated with each connection, including the connection within the logic element 515.

TABLE 4

EXAMPLE TRANSFORMATIONS FROM SLOW EDGE OF SLOW CORNER

| RESOURCE | SLOW CORNER | | FAST CORNER | |
|---|---|---|---|---|
| | SLOW EDGE | FAST EDGE | SLOW EDGE | FAST EDGE |
| Logic Element 515 | 1 | 360/400 = 0.9 | 200/400 = 0.5 | 180/400 = 0.45 |
| Connection 535 | 1 | min(0.875, 0.9, 0.9) = 0.875 | max(0.5, 0.6, 0.55) = 0.6 | min(0.45, 0.542, 0.5) = 0.45 |
| Connection 545 | 1 | 90/100 = 0.9 | 50/100 = 0.5 | 40/100 = 0.4 |
| Connection 525 | 1 | 2.4/3 = 0.8 | 1.5/3 = 0.5 | 1.2/3 = 0.4 |
| Connection 530 | 1 | 2.4/3 = 0.8 | 1.5/3 = 0.5 | 1.2/3 = 0.4 |

Returning to method 400, following the determination of transformations from the base corner and reference edge to all corners and edges in step 405, step 410 initializes variables for storing a set of short-path and long-path timing slack values to default initial values. In an embodiment, the default initial values are "impossibly" large numbers for timing slacks, such as one second. By the end of method 400, these timing slack values will reflect the amalgamated slack data from all corners.

Step 415 selects a corner from a list of unprocessed corners. Once a corner is selected by step 415, the corner is removed from the list. Step 420 transforms the timing delay values in the base corner and reference edge to equivalent timing delay values in the selected corner using the set of transformations determined in step 405. The result of step 420 is upper and lower delay bounds for each connection at the selected corner. The lower and upper delay bounds of a connection indicate the range of possible delays a connection may have at the selected corner, if the connection has a particular base corner/reference edge delay.

Step 425 performs a timing analysis to determine long-path and short-path timing slack values for the selected corner. In an embodiment, step 425 performs a conservative long-path timing analysis using the upper and lower delay bounds from step 420 to determine conservative long-path timing slack values for the selected corner. For example, a long-path timing analysis will conservatively use upper bound delay estimates on a register-to-register data path, upper bound delay estimates on the clock path to the source register, and lower bound delay estimates on the clock path to the destination register.

Typically, tighter bounds on delay result in less conservative timing analyses. When the timing values of different resources scale similarly between corners, and intra-corner delay variation is relatively small compared to inter-corner delay variation, delay bounds are reasonably tight. In some situations with loose delay bounds, the conservative bounds may be too loose given the particular optimization algorithm being used. For example, the conservative delay bounds result in over-conservative timing analyses that, in turn, produce slacks that over-constrain the optimization algorithm. To handle these situations, an embodiment applies less conservative transformations to produce tighter delay bounds; these will reduce the difficulty of the problems presented to the compilation phase, but increase the chance that the rare case may fail. In general, when determining conservative timing value transformations, it is important to consider the optimization problem that is being solved and the algorithm that is being used, and the likelihood that timing will fail if less conservative transformations are used—"conservative" does not imply blind pessimism.

Step 425 also performs a conservative short-path timing analysis using the upper and lower delay bounds from step 420 to determine conservative short-path timing slack values, for the selected corner; for example, a short-path timing analysis will conservatively use lower bound delay estimates on a register-to-register data path, lower bound delay estimates on the clock path to the source register, and upper bound delay estimates on the clock path to the destination register.

Following the determination of long-path and short-path timing slack values at the selected corner in step 425, step 430 transforms these timing slack values back to the base corner and reference edge. In an embodiment, the transformation for a timing value from a selected corner to the base corner and reference edge is the inverse of the transformation from the base corner and reference edge to the selected corner. For example, if the transformation from the base corner and reference edge to a selected corner is a scaling factor of 0.5, then the transformation from the selected corner to the base corner and reference edge is a scaling factor of 2.

It should be noted that the above assumes an embodiment which treats the edge of the selected corner as implicit. Typically, the optimization phases under consideration mainly focus optimization on the data paths of a design, rather than the clock paths of a design; clock paths are usually constrained to use dedicated resources and optimization phases do not have much flexibility to make changes to clock path implementations. Consequently, in this embodiment, the critical edge is implicit with the type of slack under consideration; for example, the critical edge for long-path slacks is the slow edge and the critical edge for short-path slacks is the fast edge.

In other embodiments, if slack values on clock paths or other information are needed, a similar evaluation can be performed to help select an appropriate transformation to use; for example, a conservative inverse-transformation based on a set of connection transformations may be selected. For example, if the slack of a path (not a connection) is desired, the slack transformation may be based on the transformations of all the connections of the path.

In further embodiments, the slack transformation which maps timing slack values back to the base corner and reference edge can be different than the inverse of the delay transformation that maps timing delay values from the base corner and reference edge. In these embodiments, the slack transformation can be any function including, but not limited to: the respective delay transformation between the two relevant corners, the timing slack value to map, and the timing delay values associated with both corners.

Step 435 compares the previously stored long-path and short-path slack values with the values transformed from the selected corner in step 430. For each connection, Step 435 conservatively replaces the previously stored slack values with the transformed slack values if the transformed slack values are less than the previously stored slack values. For example, if the previously-stored short-path and long-path timing slack values are 300 picoseconds and 100 picoseconds, respectively, and the transformed timing slack values from step 430 are 200 picoseconds each, then the previously stored short-path slack value will be replaced with the transformed slack value, but the previously stored long-path slack value will not be replaced.

Step 440 determines if there are any corners remaining in the "unprocessed" list of corners. If there are still unprocessed corners, then method 400 returns to step 415 to select a new corner. Steps 420 to 440 are then repeated for the newly selected corner. Conversely, if all of the corners have been evaluated by method 400, method 400 finishes at step 445.

The result of method 400 are "amalgamated" long-path and short-path timing slack values for each connection, external and internal to the components in the user design. These amalgamated timing slack values can then be utilized by any type of single-corner compilation phase that uses connection slacks to optimize the user design. Because these slack values are determined from multiple corners, the single-corner compilation phase—using these amalgamated long-path and short-path timing slack values generated by method 400—will optimize the user design to operate at all corners. Furthermore, if the corners were chosen such that they "linearlize" the process and operating condition space, the design will be optimized to operate robustly under most or all conditions.

Although the embodiment of method 400 described above produces amalgamated timing slack values for connections, further embodiments of method 400 can be used to produce other data used by compilation phases. This facilitates, for example, single-corner compilation phases that are path-based to optimize for multiple corners as well. Also, multiple-corner compilation phases can be used in combination with these transformation techniques; for example, these transformation techniques can be used to reduce the number of separate corners from 2*N to N for use by an N-corner compilation phase.

In an embodiment, a single-corner routing phase uses a slack allocation technique to produce minimum and maximum connection delay budgets, By using the "amalgamated" timing slack values output from method 400, the slack allocation technique can create minimum and maximum connection delay budgets that reflect long-path and short-path timing at all corners. If the routing phase determines a routing configuration that satisfies these connection delay budgets, timing constraints will be satisfied at all corners.

In another embodiment, as mentioned earlier, the compilation phase may directly monitor delay variation within a corner. In an embodiment, the compilation phase considers, for each connection, the maximum rise delay, the minimum rise delay, the maximum fall delay, and the minimum fall delay, to account for this delay variation at the base corner. To enable multiple-corner optimization, the same techniques described above can be applied. The delay transformations from the base corner to other corners, however, may need to conservatively map these four types of delays (max rise, min rise, max fall, min fall) to the other corners.

For example, a connection may have a max rise delay of 500 picoseconds and a min rise delay of 300 picoseconds at the base corner; the same connection may have a max rise delay of 200 picoseconds and a min rise delay of 100 picoseconds at the other corner. According to this embodiment, a conservative scaling factor of 0.4 may be used on max rise delays and a conservative scaling factor of 0.33 may be used on min rise delays for this example. This would offer a conservative delay mapping from the base corner to the other corner.

Once timing slack values are computed at the other corner, a slack transformation is needed to conservatively map the timing slack values back to the base corner. The slack transformation can be a function of, but not limited to, the following: the delay transformations between the two corners, the min/max rise/fall delays at both corners, and the timing slack values to map. These transformations can enable a single-corner compilation phase, which typically considers delay variation only within a corner, to optimize for multiple corners. Because the compilation phase directly models delay variation within a corner, it is free to choose resources to balance rise/fall delays and to choose resources that have less delay variation, for connections with tight timing windows.

In the context of multiple-corner optimization, embodiments that incorporate single-corner compilation algorithms that model intra-corner delay variation are typically more effective if, in certain embodiments, the percentage delay variations applicable to a set of related resources at one corner can be predictably determined from (for example, by scaling by approximately the same factor) a corresponding set of percentage delay variations at another corner. In these situations, a compilation phase operating based on delay variation at the base corner "implicitly" and "correctly" accounts for much of the delay variation at other corners. One typical situation is where the intra-corner delay variation experienced by all relevant resources at all corners is similar. For example, a resource with a 300 ps to 500 ps delay at the base corner and a delay of 150 ps to 250 ps at the fast corner experiences similar delay variation at both corners (other than the factor of two speed difference).

Continuing with the above example, handling the 300 ps to 500 ps delay variation at the base corner can "automatically" account for the 150 ps to 250 ps delay variation at the fast corner, with the factor of two speed difference accounted for using transformations. Nevertheless, because transformations can conservatively map delays and slacks, conservative embodiments can be employed if various resources experience different intra-corner delay variation at the various corners. However, the conservatism of those embodiments can impose prohibitively tight constraints on the respective compilation phase to guarantee timing, relative to a compilation algorithm that accurately models intra-corner delay variation at all the corners of interest. Consequently, other embodiments can employ less conservative transformations to ease the constraints, while keeping the chances of failure small.

It should also be noted that by combining the aforementioned techniques, additional embodiments can be crafted to work with any single-corner and multiple-corner compilation phases that may or may not consider intra-corner delay variation; conservative transformations, conservative analyses, and conservative amalgamations allow an embodiment to compensate for any "limitations" in the compilation phase (for example, the phase ignores intra-corner delay variation) by providing the necessarily conservative timing slack data needed to enable the compilation phase to satisfy timing at all corners of interest.

Figure 6:
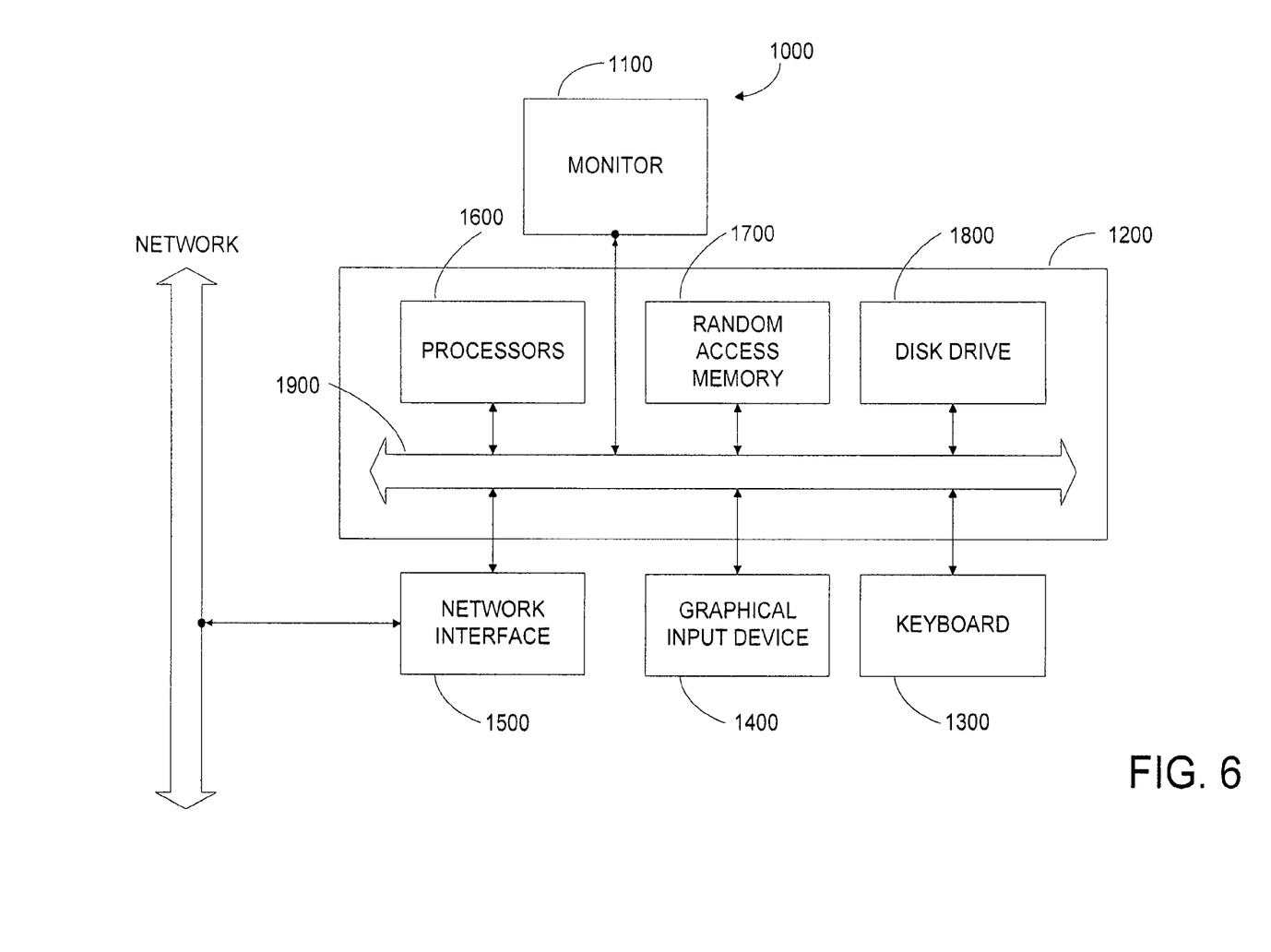
FIG. 6 illustrates an example computer system capable of implementing an embodiment of the invention.

FIG. 6 illustrates an example computer system 1000 capable of implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention. Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Further embodiments can be envisioned to one of ordinary skill in the art from the specification and figures. For example, although the invention has been discussed with reference to programmable devices such as field programmable gate arrays, it is equally applicable to applications used to design any type of logic device, such as custom ASICs, standard cell ASICs, structured or mask-programmable ASICs, PLDs (programmable logic devices), gate arrays, and general logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. An information storage medium including a plurality of instructions adapted to direct an information processing device to perform a set of steps, the set of steps comprising:
   receiving, determining, or estimating a representation for a set of paths of at least a portion of a logic design;
   receiving or determining maximum and minimum timing constraints for at least a portion of the set of paths of the logic design;
   determining delays for the portion of the set of paths of the logic design;
   identifying a set of potentially critical short-path timing paths from the portion of the set of paths of the logic design using the delays, the maximum and minimum timing constraints, and at least a partial ordering of timing paths according to a first function including at least one slack value associated with the set of timing paths and a corner; and
   revising the logic design representation considering a timing of a subset of the set of potentially critical timing paths, wherein the timing is evaluated based on a weighted average of a set of timing slacks associated with the subset of the set of potentially critical timing paths.

2. The information storage medium of claim 1, wherein a compilation phase adapted to revise the logic design includes a synthesis or technology mapping of the logic design.

3. The information storage medium of claim 1, wherein a compilation phase adapted to revise the logic design includes a clustering or placement of the logic design.

4. The information storage medium of claim 1, wherein a compilation phase adapted to revise the logic design includes a routing of the logic design.

5. An information storage medium including a plurality of instructions adapted to direct an information processing device to perform a set of steps, the set of steps comprising:
   receiving, determining, or estimating a logic design representation for a set of paths of at least a portion of a logic design;
   receiving or determining maximum and minimum timing constraints for at least a portion of the set of paths of the logic design;
   determining delays for the portion of the set of paths of the logic design;
   identifying a set of potentially critical timing paths and associated timing constraints for a plurality of corners from the portion of the set of paths using the delays, the maximum and minimum timing constraints, and at least a partial ordering of timing paths according to a first function including at least one slack value associated with the set of timing paths and a corner; and
   revising the logic design representation considering a timing of a subset of the set of potentially critical timing paths, wherein the timing is evaluated based on a weighted average of a set of timing slacks associated with the subset of the set of potentially critical timing paths.

6. The information storage medium of claim 5 further comprising:
   identifying the set of potentially critical timing paths and associated timing constraints for a plurality of corners using at least one timing analysis.

7. The information storage medium of claim 6, wherein identifying the set of potentially critical timing paths and associated timing constraints further comprises:
   accounting for intra-corner delay variation by assuming a conservative delay value.

8. The information storage medium of claim 5, wherein identifying the set of potentially critical timing paths for the plurality of corners further comprises:
   identifying a portion of the set of timing paths of the logic design having a short-path or a long-path slack below a corresponding threshold value.

9. The information storage medium of claim 5, wherein a compilation phase adapted to revise the logic design includes a synthesis or technology mapping of the logic design.

10. The information storage medium of claim 5, wherein the revised logic design representation affects the clustering or placement of the logic design.

11. The information storage medium of claim 5, wherein a compilation phase adapted to revise the logic design includes a routing of the logic design.

* * * * *